(12) United States Patent
Lee

(10) Patent No.: US 8,873,267 B2
(45) Date of Patent: Oct. 28, 2014

(54) SEMICONDUCTOR APPARATUS

(75) Inventor: Jeong Woo Lee, Icheon (KR)

(73) Assignee: SK Hynix Inc., Gyeonggi-do (KR)

( * ) Notice: Subject to any disclaimer, the term of this patent is extended or adjusted under 35 U.S.C. 154(b) by 21 days.

(21) Appl. No.: 13/601,552

(22) Filed: Aug. 31, 2012

(65) Prior Publication Data

US 2013/0176764 A1 Jul. 11, 2013

(30) Foreign Application Priority Data

Jan. 6, 2012 (KR) ........................ 10-2012-0001992

(51) Int. Cl.
*G11C 5/06* (2006.01)

(52) U.S. Cl.
USPC ........................................ 365/63; 365/189.06

(58) Field of Classification Search
USPC .............................................. 365/63, 189.06
See application file for complete search history.

(56) References Cited

U.S. PATENT DOCUMENTS

| | | | | |
|---|---|---|---|---|
| 5,109,257 A * | 4/1992 | Kondo | ...................... | 365/185.18 |
| 5,636,163 A * | 6/1997 | Furutani et al. | .......... | 365/189.03 |
| 5,648,974 A * | 7/1997 | Ingalls et al. | .................. | 714/733 |
| 5,793,685 A * | 8/1998 | Suma | ............................. | 365/201 |
| 5,905,690 A * | 5/1999 | Sakurai et al. | ............. | 365/233.1 |
| 6,226,764 B1 * | 5/2001 | Lee | ................. | 714/718 |
| 6,754,094 B2 * | 6/2004 | McClure | ....................... | 365/145 |
| 6,961,881 B2 * | 11/2005 | Yamazaki et al. | ............ | 714/718 |
| 7,400,134 B2 * | 7/2008 | Morishita et al. | ........ | 324/762.02 |
| 7,977,159 B2 * | 7/2011 | Urakawa | ....................... | 438/108 |
| 8,045,409 B2 * | 10/2011 | Hirota et al. | .................. | 365/201 |
| 8,089,817 B2 * | 1/2012 | Inaba | ....................... | 365/189.05 |
| 8,111,568 B2 * | 2/2012 | Park | ............................. | 365/201 |
| 8,149,637 B2 * | 4/2012 | Hong et al. | .................... | 365/201 |
| 8,638,626 B2 * | 1/2014 | Yang et al. | ..................... | 365/201 |
| 2001/0046167 A1 * | 11/2001 | Ayukawa et al. | ............. | 365/200 |
| 2003/0015792 A1 * | 1/2003 | Urakawa | ....................... | 257/724 |
| 2007/0241767 A1 * | 10/2007 | Tsukishiro | .................... | 324/765 |
| 2010/0195426 A1 * | 8/2010 | Yamamoto | .................... | 365/201 |
| 2012/0068229 A1 * | 3/2012 | Bemanian et al. | ............ | 257/209 |

\* cited by examiner

*Primary Examiner* — Michael Tran
(74) *Attorney, Agent, or Firm* — William Park & Associates Patent Ltd.

(57) ABSTRACT

A semiconductor apparatus includes a controller, a memory, a normal line, a test line, and a path setting unit. The normal line is provided for communication between the controller and the memory. The test line is provided for a test operation of the memory. The path setting unit connects either the normal line or the test line to the memory according to a type of access mode.

14 Claims, 2 Drawing Sheets

SEMICONDUCTOR APPARATUS

CROSS-REFERENCES TO RELATED APPLICATION

The present application claims priority under 35 U.S.C. §119(a) to Korean application number 10-2012-0001992, filed on Jan. 6, 2012, in the Korean Intellectual Property Office, which is incorporated herein by reference in its entirety as set forth in full.

BACKGROUND

1. Technical Field

The present invention relates generally to a semiconductor apparatus, and more particularly, to a system-in-package (SIP) semiconductor apparatus.

2. Related Art

In the semiconductor industry, packaging technology for an integrated circuit has been continuously developed in order to satisfy demands for miniaturization. An example of a packaging technology is the system-in-package (SIP), in which a plurality of semiconductor chips having different functions are sealed in a single package to play a part in a system.

Before memory chips are stacked, one can troubleshoot each memory chip by using normal pins of each chip. However, since a system-in-package includes a controller and stacked memory chips, one must troubleshoot the SIP only through the controller. Thus, it is difficult to accurately determine whether a defect is caused by the controller or the stack of memory chips. Therefore, direct access pins are connected to the memory chips in order to analyze the system-in-package.

FIG. 1 is a diagram schematically illustrating the configuration of a semiconductor apparatus according to the conventional art. The semiconductor apparatus is configured in the form of a system-in-package. In FIG. 1, the system-in-package includes a substrate 10, an interposer 20, a controller 30, and first and second memories 40 and 50. The substrate 10 is provided with first and second access pins 11 and 12 to communicate with an external circuit. The substrate 10 is provided with the first access pins 11 to access the controller 30 in a normal operation, and the second access pins 12 to directly access the first and second memories 40 and 50 in a test operation. The first and second access pins 11 and 12 correspond to external access pins through which the external circuit accesses the semiconductor apparatus. The second access pins 12 particularly correspond to direct access pins through which the external circuit directly accesses the memories 40 and 50, bypassing the controller 30.

The interposer 20 may include interconnections to form connections between the second access pins 12 and the first and second memories 40 and 50, between the first access pins 11 and the controller 30 (not shown), and between the controller 30 and the first and second memories 40 and 50.

The controller 30 is configured to receive external signals, such as commands, addresses, or data signals, which are input through the first access pins 11 in the normal operation. The controller 30 is also configured to transmit the received external signals to the first and second memories 40 and 50 in order to control the first and second memories 40 and 50 by way of transmission/reception circuits provided in the controller 30 and the first and second memories 40 and 50, respectively. Alternatively, the controller 30 may receive signals output from the memories 40 and 50, and output the received signals to an external component through the first access pins 11.

Since the first and second memories 40 and 50 directly receive signals input through the second access pins 12, it is possible to perform a test bypassing controller 30, only if the memories have direct reception bumps 41 and 51 to receive signals input from an external component through the second access pins 12 and the interposer 20. However, the direct reception bumps 41 and 51 increase the sizes of the memories, which is not ideal for miniaturization.

SUMMARY

A semiconductor apparatus capable of sharing signal transmission paths in both direct and normal access modes is described herein.

In an embodiment of the present invention, a semiconductor apparatus includes: a controller; a memory; a normal line through which the controller communicates with the memory; a test line for a test operation of the memory; and a path setting unit configured to connect either the normal line or the test line to the memory according to type of access mode.

In an embodiment of the present invention, a semiconductor apparatus includes: a substrate; an interposer arranged on the substrate; a controller arranged on the substrate; a memory arranged on the substrate; and a path setting unit arranged in the interposer to selectively connect the controller and a direct access pin of the substrate to the memory according to type of access mode.

In an embodiment of the present invention, a semiconductor apparatus includes: a path setting unit configured to connect either the controller or the direct access pin to the memory according to type of access mode, wherein the access mode comprises: a direct access mode in which the memory is connected to the direct access pin and is directly tested; and a normal access mode in which the memory is connected to the controller to drive the memory.

BRIEF DESCRIPTION OF THE DRAWINGS

Features, aspects, and embodiments are described in conjunction with the attached drawings, in which.

DETAILED DESCRIPTION

Hereinafter, a semiconductor apparatus according to the present invention will be described in detail with reference to the accompanying drawings through various embodiments.

Figure 1:
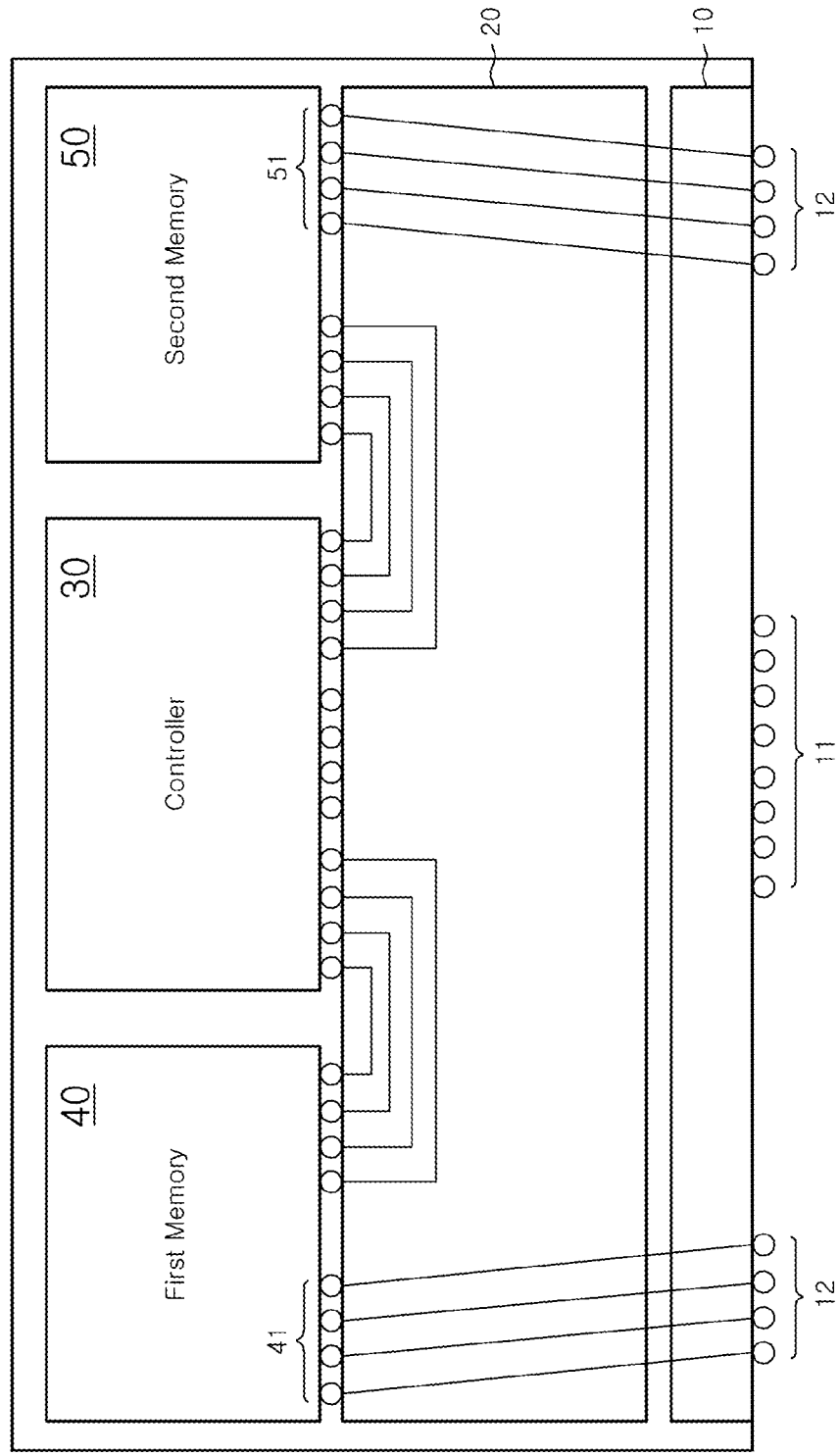
FIG. 1 is a diagram schematically illustrating the configuration of a semiconductor apparatus according to the conventional art.
Figure 2:
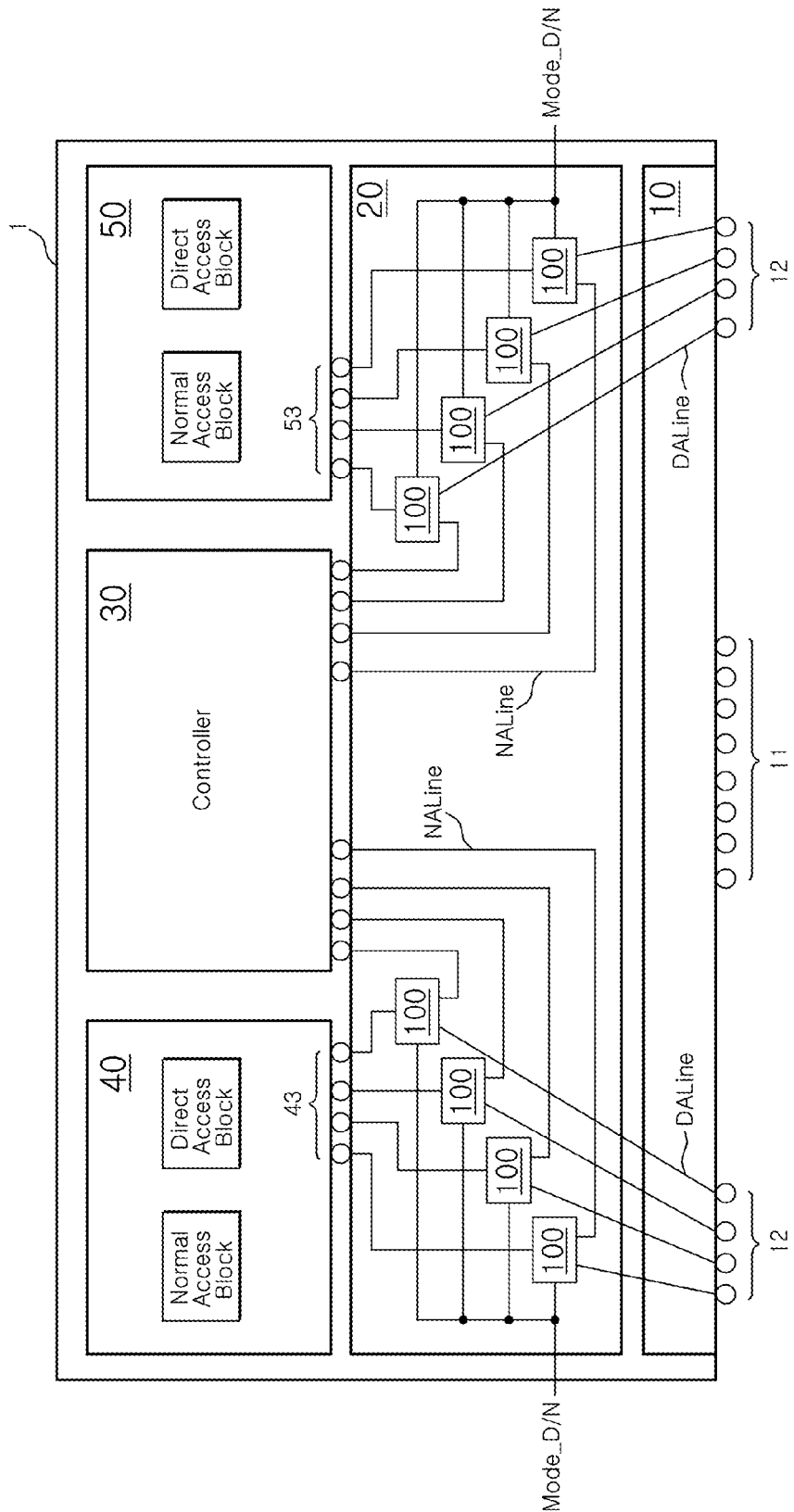
FIG. 2 is a diagram schematically illustrating the configuration of a semiconductor apparatus according to an embodiment of the present invention.

FIG. 2 is a diagram schematically illustrating the configuration of a semiconductor apparatus according to an embodiment of the present invention. In FIG. 2, the semiconductor apparatus includes a substrate 10, and an interposer 20, a controller 30, and memories 40 and 50 all arranged above the substrate 10. The substrate 10, the interposer 20, the controller 30, and the memories 40 and 50 may be in a single package to configure a system-in-package (SIP). FIG. 2 illustrates that the semiconductor apparatus includes the two memories 40 and 50, but the number of memories is not limited thereto. FIG. 2 also illustrates that the controller 30 and the memories 40 and 50 are horizontally arranged on the substrate, but the arrangement positions of the controller 30 and the memories 40 and 50 are not particularly limited.

The interposer 20 may correspond to a logic die as a chip including logic circuits for enabling communication between an external circuit (not illustrated) of the semiconductor apparatus and the controller 30, between the external circuit and the memories 40 and 50, and between the controller 30 and the memories 40 and 50, and may include signal lines between the external circuit and the controller 30, between the external circuit and the memories 40 and 50, and between the controller 30 and the memories 40 and 50. The signal lines include normal lines NALine through which normal signals are transmitted for the normal operation of the semiconductor apparatus, and test lines DALine through which test-related signals are transmitted for the test operation of the semiconductor apparatus.

The normal lines NALine connect the controller 30 to the memories 40 and 50, thus enabling communication between the controller 30 and the memories 40 and 50. The controller 30 may receive signals for the normal operation of the memories 40 and 50, such as command signals, address signals, or data signals, from an external controller (CPU, not illustrated) for example, through first access pins 11 provided in the substrate 10 of the semiconductor apparatus. The controller 30 may either transmit the signals for the normal operation to the memories 40 and 50 or receive the signals from the memories 40 and 50, both through the normal lines NALine. Signals transmitted from the memories 40 and 50 may be output to an external circuit through the first access pins 11.

The test lines DALine connect an external circuit to the memories 40 and 50, and may transmit signals for the test operation of the memories. The semiconductor apparatus may be directly accessed by an external circuit such as testing equipment. The test equipment may apply the signals for the test operation to the test lines DALine through second access pins 12 provided in the substrate 10 of the semiconductor apparatus, and the signals transmitted through the test lines DALine may be directly transmitted to the memories 40 and 50. The test-related signals output from the memories 40 and 50 may be transmitted through the test lines DALine, and may be output to the test equipment through the second access pins 12.

In an embodiment, the semiconductor apparatus includes path setting units 100. The path setting units 100 connect one of the normal lines NALine and the test lines DALine to the memories 40 and 50 according to the type of access mode. Specifically, the path setting units 100 connect either the controller 30 or the second access pins 12 to the memories 40 and 50 according to the type of access mode. The normal access mode corresponds to an operation mode for the normal operation of the memories 40 and 50, and the direct access mode corresponds to an operation mode for the test operation of the memories 40 and 50. The path setting units 100 connect the normal lines NALine to the memories 40 and 50 in the normal access mode, and connect the test lines DALine to the memories 40 and 50 in the direct access mode. Due to the path setting units 100, it is not necessary for the memories 40 and 50 to separately have bumps connected to the normal lines NALine and the test lines DALine, since the memories 40 and 50 may be connected to the normal lines NALine and the test lines DALine using sharing bumps 43 and 53.

The path setting units 100 include a plurality of multiplexing sections. The plurality of multiplexing sections are connected to the normal lines NALine and the test lines DALine, and connect either the normal lines NALine or the test lines DALine to the memories 40 and 50 according to the type of access mode. The access mode may be designated by an access mode control signal Mode_D/N, and not limited thereto. The access mode control signal Mode_D/N may also be designated by a test mode signal. For example, when the access mode control signal Mode_D/N is at a certain first level, the multiplexing sections may connect the normal lines NALine to the memories 40 and 50. When the access mode control signal Mode_D/N is at a certain second level, the multiplexing sections may connect the test lines DALine to the memories 40 and 50. The number of the multiplexing sections, the number of the normal lines NALine, and the number of the test lines DALine are each four in this example. However, the present invention is not limited thereto, and may call for a various number according to other applications.

Each of the memories 40 and 50 may include a plurality of integrated circuit chips, wherein the plurality of integrated circuit chips may be stack-connected to each other through connection members such as through vias. Each of the memories 40 and 50 may also include a normal access block and a direct access block. The normal access block receives signals transmitted through the normal lines NALine and performs the normal operation of the memories 40 and 50, and the direct access block receives signals transmitted through the test lines DALine and performs the test operation of the memories 40 and 50.

The semiconductor apparatus according to an embodiment may receive the signals transmitted through the normal lines NALine, and the signals transmitted through the test lines DALine, through common bumps 43 and 53 according to the type of access mode. Since it is possible to reduce the number of bumps used in the direct access mode, it is advantageous to incorporate common bumps in circuit design.

In the normal access mode, the path setting units 100 connect the normal lines NALine to the memories 40 and 50. Consequently, it is possible for the memories 40 and 50 to receive the signals transmitted through the normal lines NALine, which are the same signals received in the controller 30 from the external controller, to perform the normal operation. In the direct access mode, the path setting units 100 connect the test lines DALine to the memories 40 and 50. Consequently, it is possible for the memories 40 and 50 to receive the signals transmitted through the test lines DALine, which are the same signals for the test operation from the test equipment, to perform the test operation.

While certain embodiments have been described above, it will be understood to those skilled in the art understand that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising:
a controller;
a memory;
a normal line through which the controller communicates with the memory;
a test line for a test operation of the memory; and
a path setting unit configured to connect either the normal line or the test line to the memory according to type of access mode,
wherein the controller, the memory and the path setting unit are included in a single package.

2. The semiconductor apparatus according to claim 1, wherein the test line is configured to directly connect an external circuit of the semiconductor apparatus to the memory.

3. The semiconductor apparatus according to claim 1, wherein the access mode comprises:
   a direct access mode in which the memory is connected to the direct access pin and is directly tested; and
   a normal access mode in which the memory is connected to the controller to drive the memory.

4. The semiconductor apparatus according to claim 1, wherein the path setting unit comprises of a plurality of multiplexing sections.

5. A semiconductor apparatus comprising:
   a substrate;
   an interposer arranged on the substrate;
   a controller arranged on the substrate;
   a memory arranged on the substrate; and
   a path setting unit arranged in the interposer to selectively connect the controller and a direct access pin of the substrate to the memory according to the type of access mode.

6. The semiconductor apparatus according to claim 5, wherein the access mode comprises:
   a direct access mode in which the memory is connected to the direct access pin and is directly tested; and
   a normal access mode in which the memory is connected to the controller to drive the memory.

7. The semiconductor apparatus according to claim 5, wherein the substrate, the interposer, the controller, the memory, and the path setting unit are included in a single package.

8. The semiconductor apparatus according to claim 1, wherein the path setting unit comprises of a plurality of multiplexing sections.

9. A semiconductor apparatus comprising:
   a path setting unit configured to connect either a controller or a direct access pin to a memory according to type of access mode, wherein the path setting unit is connected to a sharing bump of the memory,
   wherein the access mode comprises:
   a direct access mode in which the memory is connected to the direct access pin and is directly tested; and
   a normal access mode in which the memory is connected to the controller to drive the memory.

10. The semiconductor apparatus according to claim 9, wherein the memory includes a plurality of stacked integrated circuit chips.

11. The semiconductor apparatus according to claim 9, wherein the memory comprises:
    a direct access block configured to receive a signal transmitted from the path setting unit in the direct access mode to perform a test operation; and
    a normal access block configured to receive the signal transmitted from the path setting unit in the normal access mode to perform a normal operation.

12. The semiconductor apparatus according to claim 9, wherein in the normal access mode, the controller is configured to communicate with an external controller.

13. The semiconductor apparatus according to claim 9, wherein in the direct access mode, the controller is configured to communicate with a test equipment.

14. The semiconductor apparatus according to claim 9, wherein the path setting unit comprises of a plurality of multiplexing sections.

* * * * *